(12) United States Patent
Liao et al.

(10) Patent No.: US 7,591,650 B2
(45) Date of Patent: Sep. 22, 2009

(54) ELECTRICAL CONNECTOR WITH IMPROVED HOUSING

(75) Inventors: Fang-Chu Liao, Tu-cheng (TW); Shuo-Hsiu Hsu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/214,685

(22) Filed: Jun. 19, 2008

(65) Prior Publication Data

US 2008/0318445 A1  Dec. 25, 2008

(30) Foreign Application Priority Data

Jun. 19, 2007  (CN) ........................... 200720038732

(51) Int. Cl.
*H01R 12/00* (2006.01)

(52) U.S. Cl. .............. 439/68; 439/70; 439/71

(58) Field of Classification Search .................. 439/68, 439/70, 71
See application file for complete search history.

(56) References Cited

U.S. PATENT DOCUMENTS

| 6,504,108 B1 * | 1/2003 | Lin ........................... 174/260 |
| 7,217,580 B2 * | 5/2007 | Ondricek et al. .............. 438/14 |
| 2002/0008963 A1 * | 1/2002 | DiBene et al. .............. 361/720 |

* cited by examiner

*Primary Examiner*—Tho D Ta
(74) *Attorney, Agent, or Firm*—Wei Te Chung

(57) ABSTRACT

An electrical connector for interconnecting integrated circuits (ICs) to a circuit board, includes a number of contacts (9) and an insulative housing (8) having a mating face (81) toward an IC, a mounting face (83) for attaching to a printed circuit board (7), and rows and columns of passageways extending from the mating face to the mounting face. The housing comprises outer standoffs (832) and at least one central standoff (834) on the mounting face. The height of the outer standoff is larger than that of the central standoff.

2 Claims, 5 Drawing Sheets

ELECTRICAL CONNECTOR WITH IMPROVED HOUSING

BACKGROUND OF THE INVENTION

1. Field of the Invention

The present invention generally relates to an electrical connector, and more particularly to an electrical connector connecting an IC to a printed circuit board.

2. Description of Related Art

Referring to FIGS. 1-3, a conventional Land Grid Array (LGA) connector which is employed to electrical connect an IC module 1 to a printed circuit board 2 is shown in detail. The conventional LGA connector includes a housing 3 and a plurality of contacts 4 received in the housing 3. The housing 3 has a mating face and a mounting face opposite to the mating face. A plurality of sidewalls 31 extend from peripheral edges of the housing and define therebetween an opening for receiving the IC. There are a number of standoffs 332, 334 positioned on the mounting face. The heights of these standoffs are same. When such conventional connector is soldered to the printed circuit board 2, the short between adjacent contacts will easily arise because the housing is subject to a deformation due to the high temperature.

Therefore, an IC connector having an improved housing structure is desired.

BRIEF SUMMARY OF THE INVENTION

Accordingly, an object of the present invention is to provide an electrical connector having an improved housing with different standoffs.

In order to achieve the object set forth, an electrical connector for interconnecting integrated circuits (ICs) to a circuit board, comprises a plurality of contacts and an insulative housing having a mating face toward an IC, a mounting face for attaching to a printed circuit board, and rows and columns of passageways extending from the mating face to the mounting face. The housing comprises outer standoffs and at least one central standoff on the mounting face. The height of the outer standoff is larger than that of the central standoff.

Other objects, advantages and novel features of the invention will become more apparent from the following detailed description of the present embodiment when taken in conjunction with the accompanying drawings.

BRIEF DESCRIPTION OF THE DRAWINGS

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE PREFERRED EMBODIMENT

Figure 1:
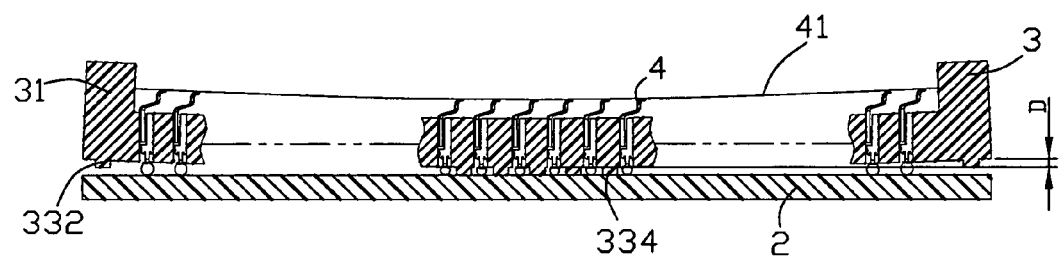
FIG. 1 is a cross-sectional view of a conventional IC connector mounted on a printed circuit board.
Figure 2:
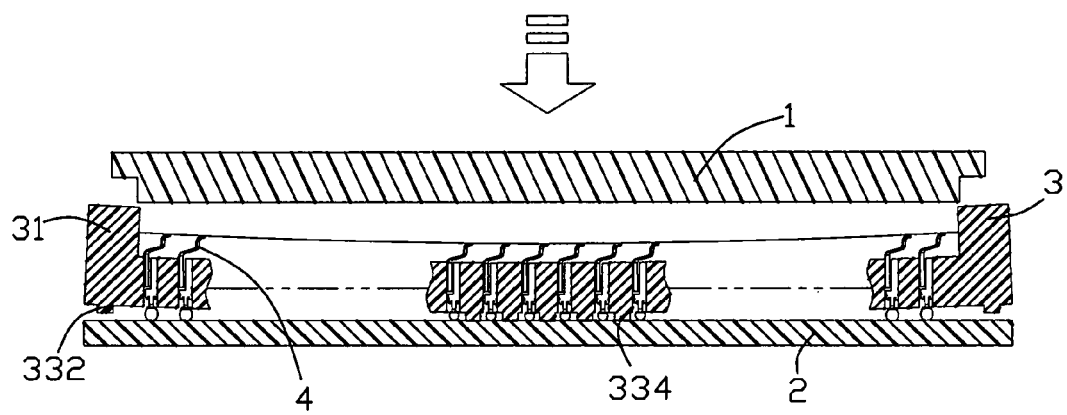
FIG. 2 is a cross-sectional view of the conventional IC connector mounted on the printed circuit board and an IC module.
Figure 3:
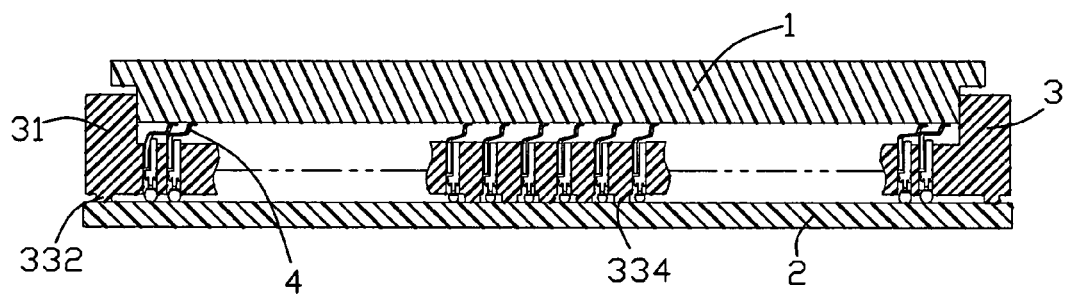
FIG. 3 is an assembled, cross-sectional view of the conventional IC connector and the IC module.

Reference will now be made to the drawing figures to describe the present invention in detail.

Figure 4:
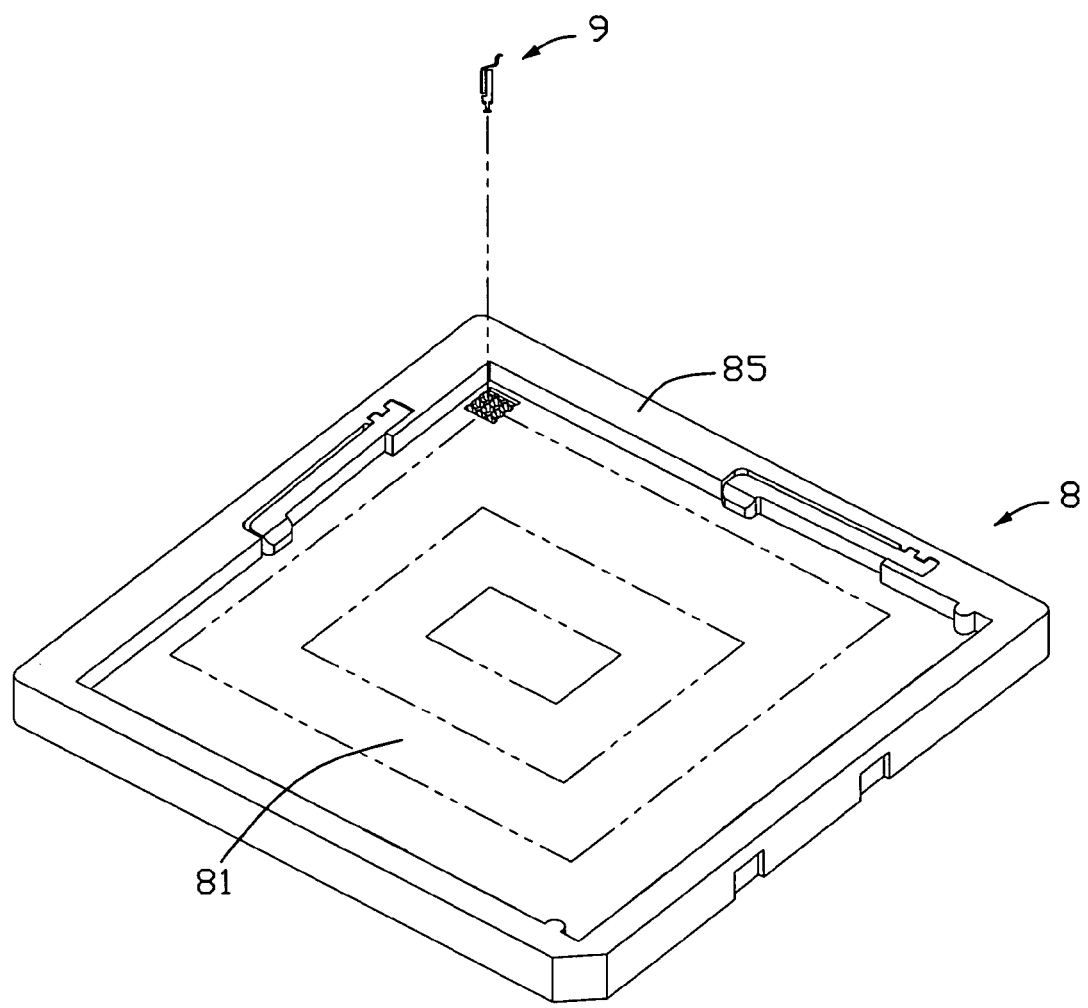
FIG. 4 is a perspective view of an IC connector in accordance with the present invention.
Figure 5:
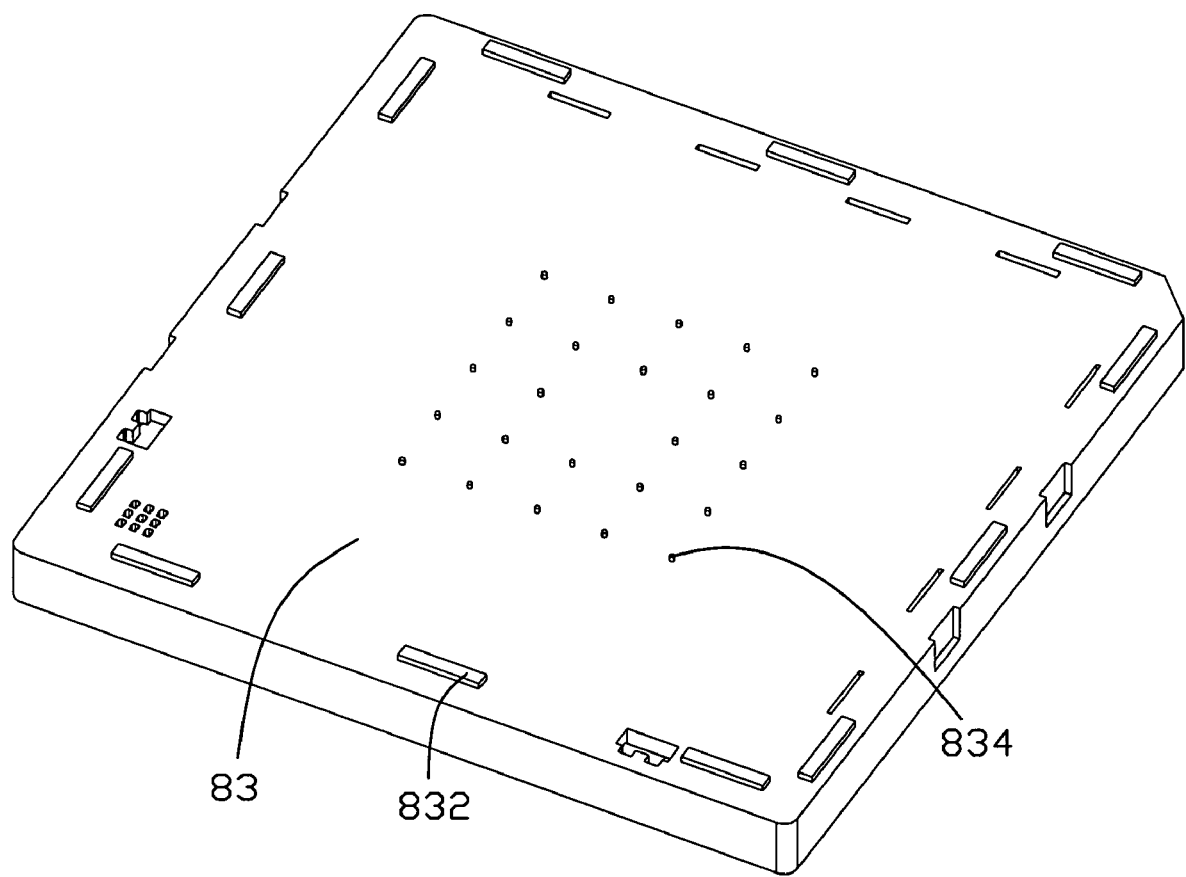
FIG. 5 is another perspective view of the IC connector shown in FIG. 4.
Figure 6:
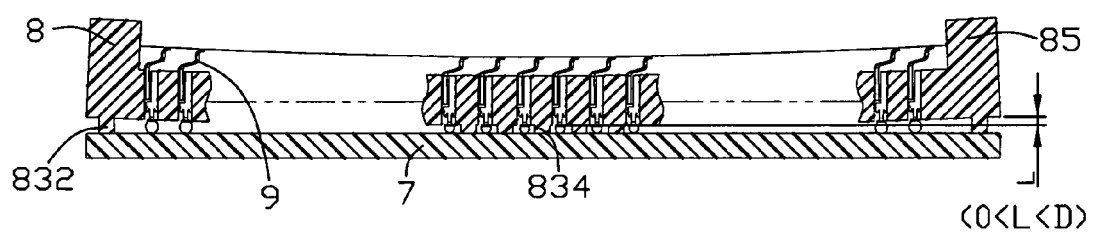
FIG. 6 is a cross-sectional view of the IC connector shown in FIG. 1 which is mounted on a printed circuit board.

FIGS. 4-6 shows an electrical connector in accordance with the embodiment of the present invention. In the preferred embodiment, the electrical connector can be an Land Grid Array (LGA) connector mounted on a mother circuit board 7 for electrically connecting an IC (not shown) thereon. For simplicity reason, conventional known structures of an IC connector, for example, a cover and a lever etc, are not presented in the figures of the present application.

The electrical connector comprises an insulative housing 8 configured in a flat, rectangular shape and a plurality of contacts 9. For simplify, only one exemplary contact is shown in corresponding figures. The insulative housing 8 defines an opening surrounded by a plurality of sidewalls 85 for receiving the IC. A mating face 81 is formed toward the IC and a mounting face 83 is formed opposite to the mating face 81 for attaching to the mother circuit board 7. A plurality of passageways are defined from the mating face 81 to the mounting face 83, and arranged in rows and columns. There are a plurality of outer standoffs 832 positioned on the mounting face 83 adjacent to peripheral edges of the housing 8. Each outer standoff 832 extends lengthwise and protrudes outwardly. There are also a plurality of central standoffs 834 extending from the middle section of the mounting face 83. Each central standoff 834 is formed in a column shape which is different from the outer standoff 832.

Turn to FIG. 6, in a preferred embodiment, the height of the outer standoff 832 is larger than that of the central standoff 834. While, The height difference L of the central and outer standoff is not larger than the flatness of the mounting face 83 of the housing 8 which is labeled D. In such a manner, when the connector is subject to a high temperature test, the possibility of short occurred between two adjacent contacts will be highly decreased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector assembly comprising:
a printed circuit board;
an electrical connector including:
an insulative housing defining an upward recess therein surrounded by a base wall and a plurality of peripheral walls;
a plurality of contacts disposed in the base wall with contacting sections extending upwardly into the recess;
each of said contacts being equipped with a solder ball at a bottom end and exposed under an underside of the housing;
a group of first standoffs downwardly extending and located in a central area of the underside of the housing;

and a group of second standoffs downwardly extending and located in a peripheral area of the underside of the housing; wherein a height of said second standoff is larger than that of the first standoff for compensating warpage of the housing during heating;

wherein the solder ball located in the central area is smaller than that in the peripheral area.

2. The assembly as claimed in claim 1, wherein a difference between the height of the first standoff and that of the second standoff is not larger than a height difference between the peripheral area and the central area due to said warpage.

* * * * *